US007564251B2

(12) United States Patent
Rupp

(10) Patent No.: US 7,564,251 B2
(45) Date of Patent: Jul. 21, 2009

(54) METHOD FOR IDENTIFYING ANALOG MEASURING SENSORS AND ASSOCIATED ASSEMBLY

(75) Inventor: Jürgen Rupp, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 268 days.

(21) Appl. No.: 10/578,306

(22) PCT Filed: Oct. 29, 2004

(86) PCT No.: PCT/EP2004/052714

§ 371 (c)(1), (2), (4) Date: May 4, 2006

(87) PCT Pub. No.: WO2005/045783

PCT Pub. Date: May 19, 2005

(65) Prior Publication Data

US 2007/0035316 A1 Feb. 15, 2007

(30) Foreign Application Priority Data

Nov. 4, 2003 (DE) ................................ 103 51 356

(51) Int. Cl.
*G01R 29/22* (2006.01)
*G01R 27/08* (2006.01)

(52) U.S. Cl. ....................................... 324/727; 324/713

(58) Field of Classification Search ................. 324/727, 324/600, 522, 713, 71.1, 76.11
See application file for complete search history.

(56) References Cited

U.S. PATENT DOCUMENTS 4,467,271 A 8/1984 Ruckenbauer et al.
4,840,066 A 6/1989 Botsco et al.
4,962,368 A * 10/1990 Dobrzanski et al. .......... 340/514
5,122,970 A * 6/1992 Gilbert et al. ................. 702/33
5,489,888 A 2/1996 Jagiella et al.
6,104,304 A * 8/2000 Clark et al. ................. 340/664
6,115,654 A 9/2000 Eid et al.
6,571,189 B2 * 5/2003 Jensen et al. ................ 702/104
6,661,217 B2 * 12/2003 Kimball et al. .......... 324/76.41
2002/0130673 A1 * 9/2002 Pelrine et al. ............... 324/727
2003/0225334 A1 * 12/2003 Hicks ......................... 600/500
2004/0150516 A1 * 8/2004 Faetanini .................... 340/444

FOREIGN PATENT DOCUMENTS

DE 43 09 842 C1 6/1994
DE 198 47 841 A1 5/2000
EP 0 660 089 6/2005

OTHER PUBLICATIONS

International Search Report mailed Mar. 24, 2005.

* cited by examiner

*Primary Examiner*—Timothy J Dole
*Assistant Examiner*—Hoai-An D Nguyen
(74) *Attorney, Agent, or Firm*—Staas & Halsey LLP

(57) ABSTRACT

Individual measuring sensors each have a different specific signal type and must therefore be appropriately connected to the analog measuring inputs. An adjustable voltage with adjustable current limitation, or an adjustable current with adjustable voltage clamping is used. The voltage or current is connected to the measuring sensors and the corresponding signal is detected and classified according to the sensor type. This permits the automated integration of the measuring sensor. The corresponding assembly can form part of the complete module.

12 Claims, 3 Drawing Sheets

METHOD FOR IDENTIFYING ANALOG MEASURING SENSORS AND ASSOCIATED ASSEMBLY

CROSS REFERENCE TO RELATED APPLICATIONS

This application is based on and hereby claims priority to PCT Application No. PCT/EP2004/05271 filed on Oct. 29, 2004 and German Application No. 10351356.6 filed Nov. 4, 2003, the contents of which are hereby incorporated by reference.

BACKGROUND OF THE INVENTION

The invention relates to a method for identifying analog measuring sensors in measurement and automation technology circuits where each of the individual measuring sensors has a specific signal type. Besides this, the invention also relates to an associated device.

Devices for measurement and automation technology frequently have analog measurement inputs. The common signal types here are +/−10 V, +/−20 mA, 4 to 20 mA, 50 mV (thermocouples) or resistance measurements, for example for PT 100 or PT 1000Currently, the signal type is mostly set manually on the automation equipment, whether by hardware using switches/coding plugs or by means of software using electronic switches. Any incorrect setting generally leads to a malfunction, in the worst case indeed to the destruction of the measurement input.

With the related art, therefore, the signal type is prescribed. This means that in order to avoid errors and damage, the correct setting must be checked.

U.S. Pat. No. 6,115,654 A discloses a sensor/interface system, and an associated operating method for this system, with which it is possible to recognize individual sensors when different sensors are connected to the system and all the sensors are activated simultaneously. For this purpose, the sensor signals are input into a data processing device. This system is used, in particular, with permanently installed sensors in an aircraft, to enable faults which are present in the system to be recognized and/or incipient faults to be predicted in good time, by the monitoring effected during the operation of the system.

SUMMARY OF THE INVENTION

Starting from this last related art, it is one possible object of the invention to specify a method, using which measurement sensors can be automatically recognized in respect of their signal type. Besides this, it is to devise a device with which the method can be carried out in a simple manner.

The inventor proposes a method and device to automatically recognize signal type so that a correct setting can be made, also automatically, or, in the event of an incorrect setting, a warning message generated.

The method is based on the making of measurements on the sensor which is connected, from which the different current/voltage characteristic curves of he sensor types are recognized. For these measurements, an adjustable voltage source with a current limiter which can also be adjusted, or an adjustable current source with adjustable voltage limitation, are both suitable.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
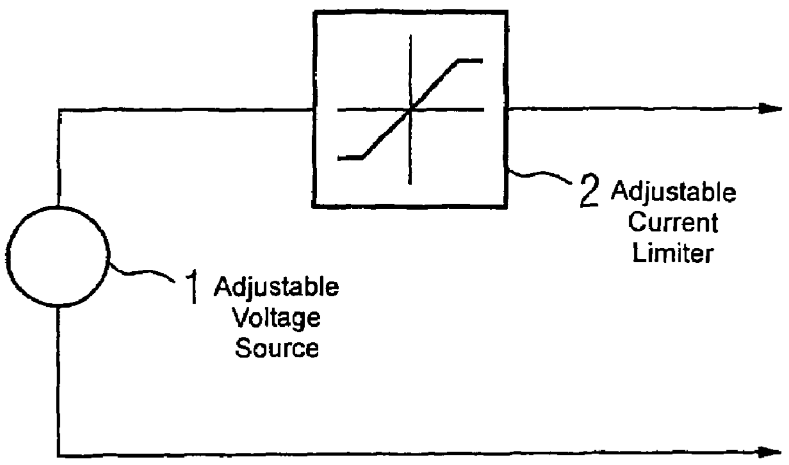
FIGS. 1 and 2 show circuit diagrams of the measuring equipment for measuring sensor characteristics.

Reference will now be made in detail to the preferred embodiments of the present invention, examples of which are illustrated in the accompanying drawings, wherein like reference numerals refer to like elements throughout.

Figure 2:
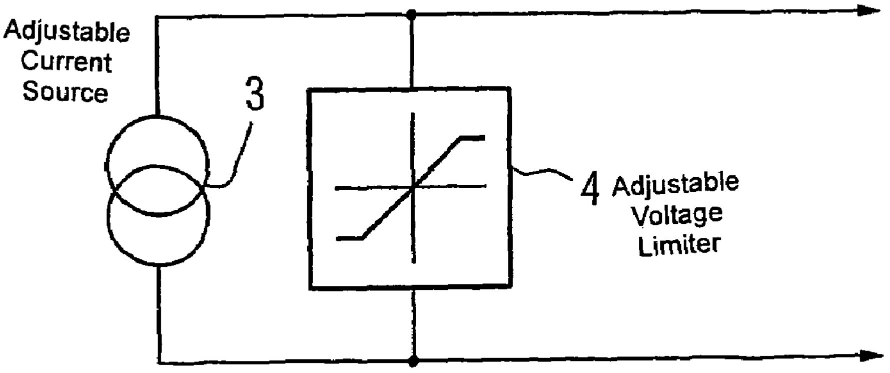

FIGS. 1 and 2 represent circuit diagrams of the test electronics. In these, 1 represents an adjustable voltage source and 2 and adjustable current limiter, 3 an adjustable current source and 4 an adjustable voltage limitation, with connections being provided for the sensor which is to be tested. The two alternatives are equivalent. For the measurements, an adjustable voltage source with a current limiter which can also be adjusted, or an adjustable current source with adjustable voltage limitation, are both suitable. To measure the characteristic curve, the voltage or the current should be varied, and both measurement values recorded at the terminals to the sensor.

Figure 3:
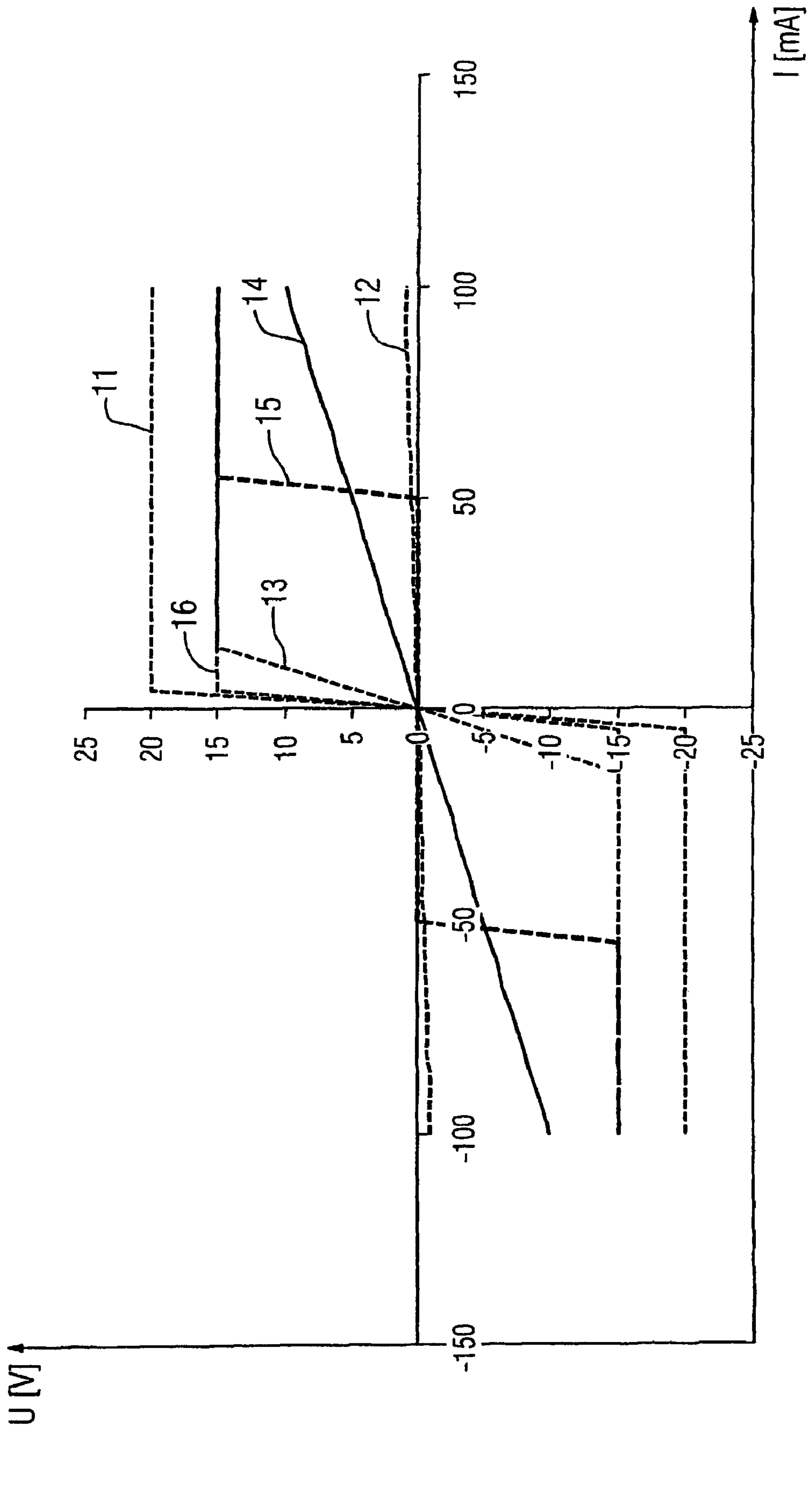
FIG. 3 shows a summary of different characteristic curves.

FIG. 3 summarizes the characteristic curves, 11 to 16, for the relevant signal types from measuring sensors other than thermocouples, which are discussed further below: the plot shows the sensor current I in milliAmperes (mA) along the abscissa against the sensor voltage U in Volts (V) on the ordinate. It can be clearly seen that all the characteristic curves are different, and thus can be unambiguously detected. The case which is hardest to recognize for the voltage-current sensors, a zero signal, is shown. In the case of a non-zero signal, the corresponding flanks are offset. For unipolar sensors, the inflection in the characteristic curve starts at zero. A characteristic which can also be unambiguously detected.

Figure 4:
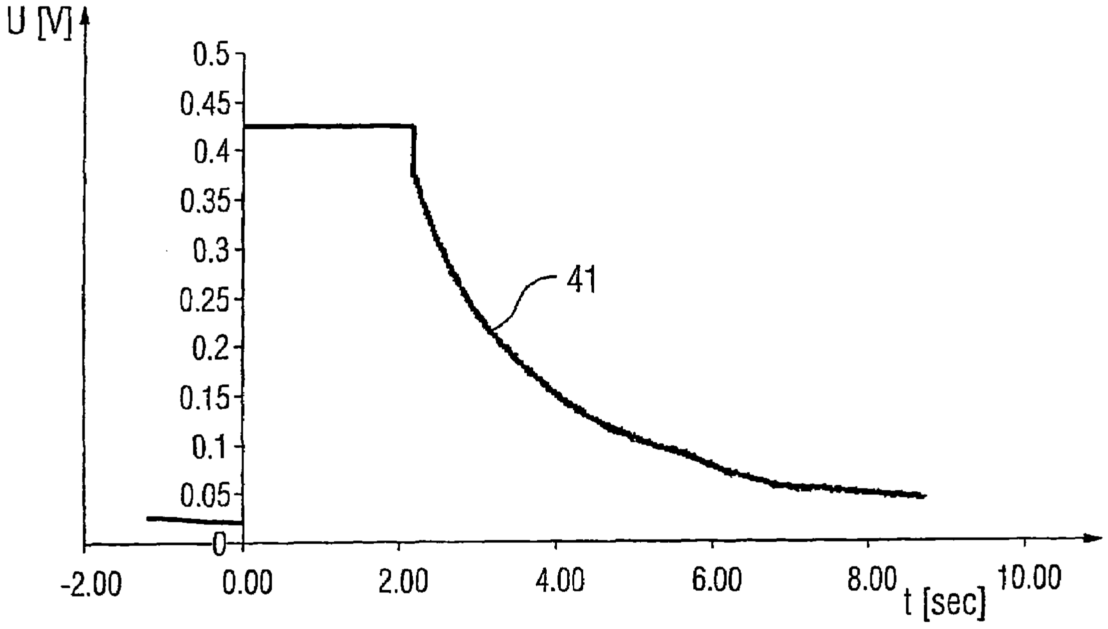
FIGS. 4 and 5 show decay curves for cooling processes for thermocouples with unipolar and antipolar responses.
Figure 5:
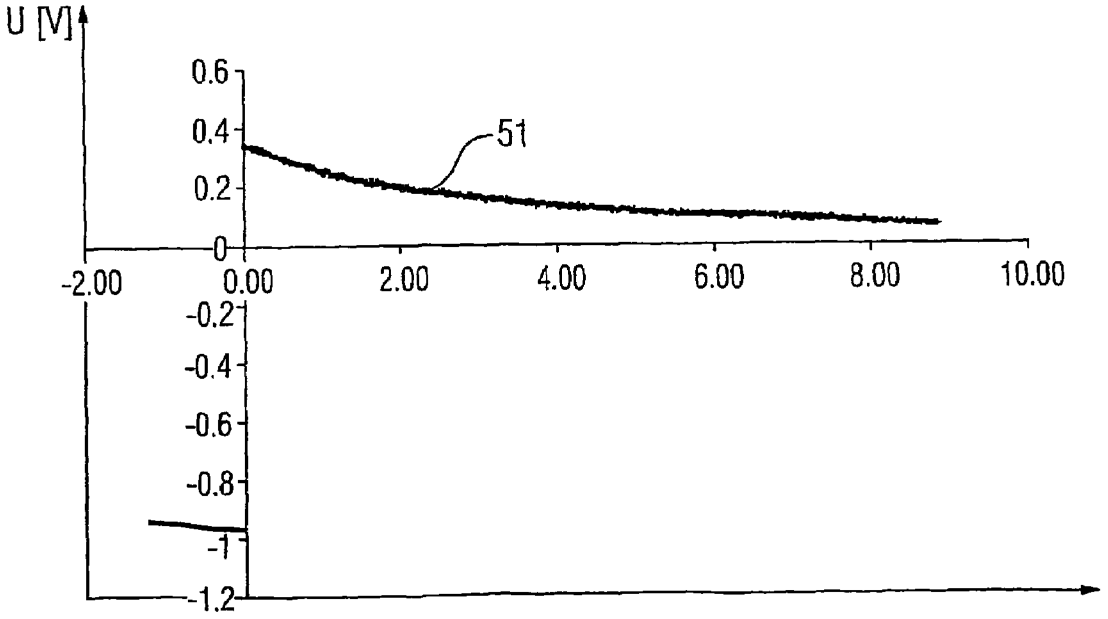

In order to recognize thermocouples, the decay curves must be analyzed. The recognition of thermocouples is effected through the response of the element to excitation by a current. FIGS. 4 and 5 show the oscillograms of such an excitation with different polarities, with the abscissa indicating the time in seconds and the ordinate the. voltage in volts. The large time constant of the decay process and the reversal of the polarity can be clearly seen in FIG. 5.

In what follows, details are given of the different application possibilities.

The distinguishing characteristic of voltage sensors which correspond to the characteristic curve 15 is that they apply a defined voltage to the measurement input up to the current limit, which is due to the technical realization using electronic circuits. The common sensors generally have an output voltage range of 0 to 10 V or (bipolar) of +/−10 V. The maximum current which these sensors can supply lies mostly in the range of 5 mA up to around 50 mA. The method described recognizes such a voltage sensor by injecting a variable current into the sensor (e.g. from −100 mA up to +100 mA). While this is done, the voltage at the terminals is monitored. If a voltage sensor is connected, it will hold the terminal voltage almost constant in the region of its current supply capability, because its internal resistance is small, and then at the current limit there is a step increase in the voltages. Alternatively, it is also possible to use a variable voltage source with current limitation for the measurements. In this case, the current consumption of the sensor will switch over abruptly when the sensor voltage is exceeded.

The distinguishing characteristic of current sensors which correspond to the characteristic curve 16 is that they inject a defined current into the measurement input up to their voltage limit, which is due to the technical realization using electronic circuits. The common sensors generally have an output current range of 0 to 20 mA, 4 to 20 mA or (bipolar) of +/−20 mA. The maximum voltage which these sensors can supply is mostly less than +/−15 V. The method described recognizes such a current sensor by applying a variable voltage to the sensor, e.g. from −100 mA up to +100 mA. While this is done, the current at the terminals is monitored. If a current sensor is connected, then in the region of its output current it will cause a step change in the terminal voltage, between the maximum output voltage values. The measurement of the characteristic curve 16 can also be effected by connecting up a variable voltage source and monitoring the output current.

Resistive sensors can also be detected using a variable voltage or current source. This gives characteristic curves, 13 or 14 as applicable, which are nearly linear over the entire range. From their slope it is then also possible to distinguish different types, e.g. PT100 or PT1000. Four-wire measurements can also be made, by connecting the test signal to the supply wires and using the other wires for the test measurements.

Line short-circuits corresponding to the characteristic curve 12 have the same characteristics as a voltage source of 0 V with a low internal resistance, with the difference that no voltage limitation occurs across the measurement range.

A line break, corresponding to the characteristic curve 11, has the same response as a current sensor with 0 mA output current, i.e. high internal resistance, with the difference that no current limitation occurs across the measurement range.

Thermocouples have a response which is initially similar to a relatively high-resistance voltage source, a far distant line short-circuit, or even a low-resistance resistive sensor (PT100). They are distinguished by selective excitation of the thermoelectric effect, using an injected current. This current causes warming of one connection point, e.g. the measurement location, and a cooling of the other point, e.g. the compensation location. The site of the warming/cooling is swapped by reversing the polarity of the excitation current, so as to exploit the Peltier effect.

After the excitation current is switched off, the response of the thermocouple can be detected, this taking the form of a decaying voltage source with a time constant of around one to 10 seconds or more, producing either the characteristic curve 41 shown in FIG. 4 or the characteristic curve 51 shown in FIG. 5. Depending on the thermal time constant of the two thermoelectric junctions, the polarity is the same as the excitation voltage in the case of FIG. 4 and the opposite for FIG. 5.

Automatic recognition of the signal type for measuring sensors has the following advantages:

- avoidance of any damage to the measurement inputs
- avoidance of malfunctions in the plant, and hence avoidance of damage to the plant
- shorter times to put plant into service, due to the automatic diagnosis
- recognition of faults in connected measuring transducers, line breaks and short-circuits
- the normal commercially-available sensors can be detected with no specific enhancements.

The recognition or identification of the measuring sensors can in practice be carried out directly where they are used. The measurement device for this purpose can be realized as a separate device or can equally well be integrated into the module which is to be used. This results in considerable simplifications for practical use, because staff do not need to carry out separate checks on the individual measuring sensors, but rather can make the connections without testing them. The testing then takes place in the plant containing the modules.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A method for identifying an analog measuring sensor in a measurement and automation technology circuit, each measuring sensor having a specific signal type, the method comprising:

- using either an adjustable voltage source with an adjustable current limiter or alternatively an adjustable current source with an adjustable voltage limiter;
- connecting the voltage source or the current source to the measuring sensor and varying the voltage or current with time;
- when using the voltage source, detecting the current;
- when using the current source, detecting the voltage; and
- classifying the sensor according to the applied voltage and detected current or applied current and detected voltage, wherein a thermocouple is identified using a high-resistance voltage source, a far distant line short-circuit, and/or a low-resistance resistive sensor.

2. The method in accordance with claim 1, wherein a thermocouple is detected by a selective excitation of the thermoelectric effect, and selective excitation of the thermoelectric effect is achieved by an injected current.

3. The method in accordance with claim 2, wherein the injected current causes warming at a measurement point in the sensor, and cooling at a compensation point in the sensor.

4. The method in accordance with claim 3, wherein reversing polarity for the injected current causes the measurement point to be cooled and the compensation point to be warmed.

5. The method in accordance with claim 3, wherein after the injected current is switched off, the thermocouple exhibits a decay curve, and the decay curve is detected.

6. The method in accordance with claim 4, wherein after the injected current is switched off, the thermocouple exhibits a decay curve, and the decay curve is detected.

7. A device for identifying an analog measuring sensor, comprising:

- an adjustable voltage source with a pre-specifiable current limiter or an adjustable current source with a pre-specifiable voltage limiter, the voltage source or the current source being connected to the measuring sensor;
- an output device to measure how the sensor responds to the voltage source or the current source, and to produce a characteristic signal curve; and
- a discrimination unit to identify the sensor based on the characteristic signal curve, wherein a thermocouple is identified using a high-resistance voltage source, a far distant line short-circuit, and/or a low-resistance resistive sensor.

8. The device in accordance with claim 7, wherein the system is part of a module attached to an industrial automation system.

9. A method for identifying an analog measuring sensor in a measurement and automation technology circuit, each measuring sensor having a specific signal type, the method comprising:

using either an adjustable voltage source with an adjustable current limiter or alternatively an adjustable current source with an adjustable voltage limiter;

connecting the voltage source or the current source to the measuring sensor and varying the voltage or current with time when using the voltage source, detecting the current;

when using the current source, detecting the voltage; and classifying the sensor according to the applied voltage and detected current or applied current and detected voltage, wherein the sensor is classified as a line short-circuit sensor using a voltage source of 0 V with a low internal resistance, and detecting no current limitation in a measurement range.

10. A method for identifying an analog measuring sensor in a measurement and automation technology circuit, each measuring sensor having a specific signal type, the method comprising:

using either an adjustable voltage source with an adjustable current limiter or alternatively an adjustable current source with an adjustable voltage limiter;

connecting the voltage source or the current source to the measuring sensor and varying the voltage or current with time;

when using the voltage source, detecting the current;

when using the current source, detecting the voltage; and classifying the sensor according to the applied voltage and detected current or applied current and detected voltage, wherein the sensor is classified as a line break sensor using a current source with an output current of 0 mA and a high resistance, and detecting no voltage limitation.

11. A device for identifying an analog measuring sensor, comprising:

an adjustable voltage source with a pre-specifiable current limiter or an adjustable current source with a pre-specifiable voltage limiter, the voltage source or the current source being connected to the measuring sensor;

an output device to measure how the sensor responds to the voltage source or the current source, and to produce a characteristic signal curve; and a discrimination unit to identify the sensor based on the characteristic signal curve, wherein the sensor is classified as a line short-circuit sensor using a voltage source of 0 V with a low internal resistance, and detecting no current limitation in a measurement range.

12. A device for identifying an analog measuring sensor, comprising:

an adjustable voltage source with a pre-specifiable current limiter or an adjustable current source with a pre-specifiable voltage limiter, the voltage source or the current source being connected to the measuring sensor;

an output device to measure how the sensor responds to the voltage source or the current source, and to produce a characteristic signal curve; and a discrimination unit to identify the sensor based on the characteristic signal curve, wherein the sensor is classified as a line break sensor using a current source with an output current of 0 mA and a high resistance, and detecting no voltage limitation.

* * * * *